United States Patent
Hung

(10) Patent No.: US 7,466,545 B2
(45) Date of Patent: Dec. 16, 2008

(54) DETACHABLE FAN APPARATUS FOR QUICK MAINTENANCE

(75) Inventor: Te-Fu Hung, Keelung (TW)

(73) Assignee: Portwell Inc., Taipei (TW)

( * ) Notice: Subject to any disclaimer, the term of this patent is extended or adjusted under 35 U.S.C. 154(b) by 19 days.

(21) Appl. No.: 11/655,907

(22) Filed: Jan. 22, 2007

(65) Prior Publication Data

US 2008/0043432 A1    Feb. 21, 2008

(30) Foreign Application Priority Data

Aug. 17, 2006  (TW) .............................. 95214580 U

(51) Int. Cl.
*H05K 7/20*    (2006.01)
(52) U.S. Cl. .................... 361/687; 361/695; 454/184
(58) Field of Classification Search ................ 361/687, 361/694–695; 454/184
See application file for complete search history.

(56) References Cited

U.S. PATENT DOCUMENTS

| | | | | |
|---|---|---|---|---|
| 5,673,029 A * | 9/1997 | Behl et al. | .................. | 340/635 |
| 6,215,660 B1 * | 4/2001 | Lin | ............................. | 361/695 |
| 6,236,546 B1 * | 5/2001 | Blickhan et al. | .............. | 361/54 |
| 6,297,950 B1 * | 10/2001 | Erwin | ........................ | 361/685 |
| 6,313,989 B1 * | 11/2001 | Kuang | .................. | 252/62.9 PZ |
| 6,421,238 B1 * | 7/2002 | Negishi | ....................... | 361/695 |
| 6,504,716 B2 * | 1/2003 | Huang et al. | ................ | 361/695 |
| 6,999,313 B2 * | 2/2006 | Shih | ............................ | 361/695 |
| 7,312,990 B2 * | 12/2007 | Mangold | .................... | 361/695 |
| 2006/0256522 A1 * | 11/2006 | Wei et al. | .................... | 361/695 |

\* cited by examiner

*Primary Examiner*—Gregory D Thompson
(74) *Attorney, Agent, or Firm*—Bacon & Thomas, PLLC

(57) ABSTRACT

A detachable fan apparatus for quick maintenance installable in a computer casing and swappable for maintenance without turning off the fan includes a frame, a stopping plate on the frame, at least one fan at the fan, a gap between the fan and the frame for installing a filter, an axial rod at an end of the frame and pivotally connected with a pivotal of the computer casing, and a stopping pillar near the opening. When an end without the axial rod is secured with the computer casing, the frame can be fixed onto the computer casing. For the change of a filter, a secured end of the frame is separated from the computer casing, and the frame is turned outward and inclined to a predetermined angle until the stopping plate is pressed onto the stopping pillar by the pivotal hole and axial rod for the change of a filter.

4 Claims, 5 Drawing Sheets

DETACHABLE FAN APPARATUS FOR QUICK MAINTENANCE

BACKGROUND OF THE INVENTION

1. Field of the Invention

The present invention relates to a detachable fan apparatus for quick maintenance, and more particularly to a fan apparatus that can be swapped by engaging and pressing a computer casing with pivotal holes and axial rods of a frame and stopping pillars with a stopping plate, such that when it is necessary to change a filter on the frame, users simply incline the frame outward to a specific angle without removing the whole frame from the computer casing to achieve the swapping effect.

2. Description of the Related Art

Referring to FIG. 1 for a detachable fan apparatus as disclosed in R.O.C. Pat. Application No. 93204796, the apparatus includes a casing, a guide track fixing frame disposed at a specific position of the casing, a sliding guide track disposed separately on both sides of the geode track fixing frame, a fan having a shape corresponding to the guide track fixing frame and mounted onto the guide track fixing frame, an embedding body separately disposed on both sides of the fan fixing frame and corresponding to the slide guiding track, so that the fan fixing frame is movable back and forth in the guide track fixing frame, and the fan fixing frame installs at least one heat dissipating fan, and the fan fixing frame also includes an electric plug pluggable into its corresponding electric socket.

When the fan apparatus of this structure is used, the electric plug is plugged into the electric socket and electrically connected with the electric socket in the casing and then embedded into a guide track fixing frame of the fan fixing frame for mounting and fixing the heat dissipating fan of the casing. On the other hand, if it is necessary to remove the apparatus, the fan fixing frame is moved outward along the sliding guide track to separate the heat dissipating fan from the casing. However, the fan apparatus of this structure still has the following drawbacks.

1. Impedance will be produced easily by the electric connection through the electric plug.
2. If it is necessary to remove the apparatus, the screws are loosened to move the fan fixing frame outward along the sliding guide track, and the filter is removed from the surface of the fan. Users have to stop the operation of the fan to remove the fan fixing frame completely from the casing for a swap. According to statistics, such arrangement is designed mostly for a change of filter only, but not for the purpose of repairing the fan. Therefore, such arrangement definitely cannot meet user requirements.

SUMMARY OF THE INVENTION

In view of the shortcomings of the aforementioned conventional detachable heat dissipating fan, the inventor of the present invention based on years of experience in the related industry to conduct extensive researches and experiments, and finally developed a detachable fan apparatus for quick maintenance in accordance with the present invention.

Therefore, it is a primary objective of the present invention to provide a detachable fan apparatus for quick maintenance which is installed to a computer casing, and the computer casing includes at least one opening disposed on a surface of the computer casing, and both sides of the opening separately have a pivotal hole, pivotally connected to a frame. The frame installs at least one fan, and a gap is maintained between the fan and the frame for installing a filter, so that an end without the axial rod of the frame can be secured onto the computer casing, and the frame can be fixed onto a surface of the computer casing. If it is necessary to change the filter, a secured end of the frame is separated from the computer casing, and the frame is turned outward until the stopping plate is pressed onto the stopping pillar by means of the pivotal hole and the axial rod, so that the frame is inclined to a predetermined angle for the change of filter, and a convenient use without the need of stopping the operation of the fan or removing the frame can be achieved.

Another objective of the present invention is to provide a detachable fan apparatus for quick maintenance, wherein the stopping pillar is disposed proximate to the opening of the computer casing and corresponding to a stopping plate of the frame, such that when the frame is turned outward, the stopping pillar and the stopping plate are pressed with each other to drive the frame to incline to a predetermined angle.

A further objective of the present invention is to provide a detachable fan apparatus for quick maintenance, wherein the fan is connected with the computer casing by the electric circuit, so that when the frame is turned outward for changing a filter, the fan can continue its operation for a convenient use of the fan.

To make it easier for our examiner to understand the present invention, the following embodiment accompanied with the related drawings are described in details.

DETAILED DESCRIPTION OF THE PREFERRED EMBODIMENTS

Figure 1:
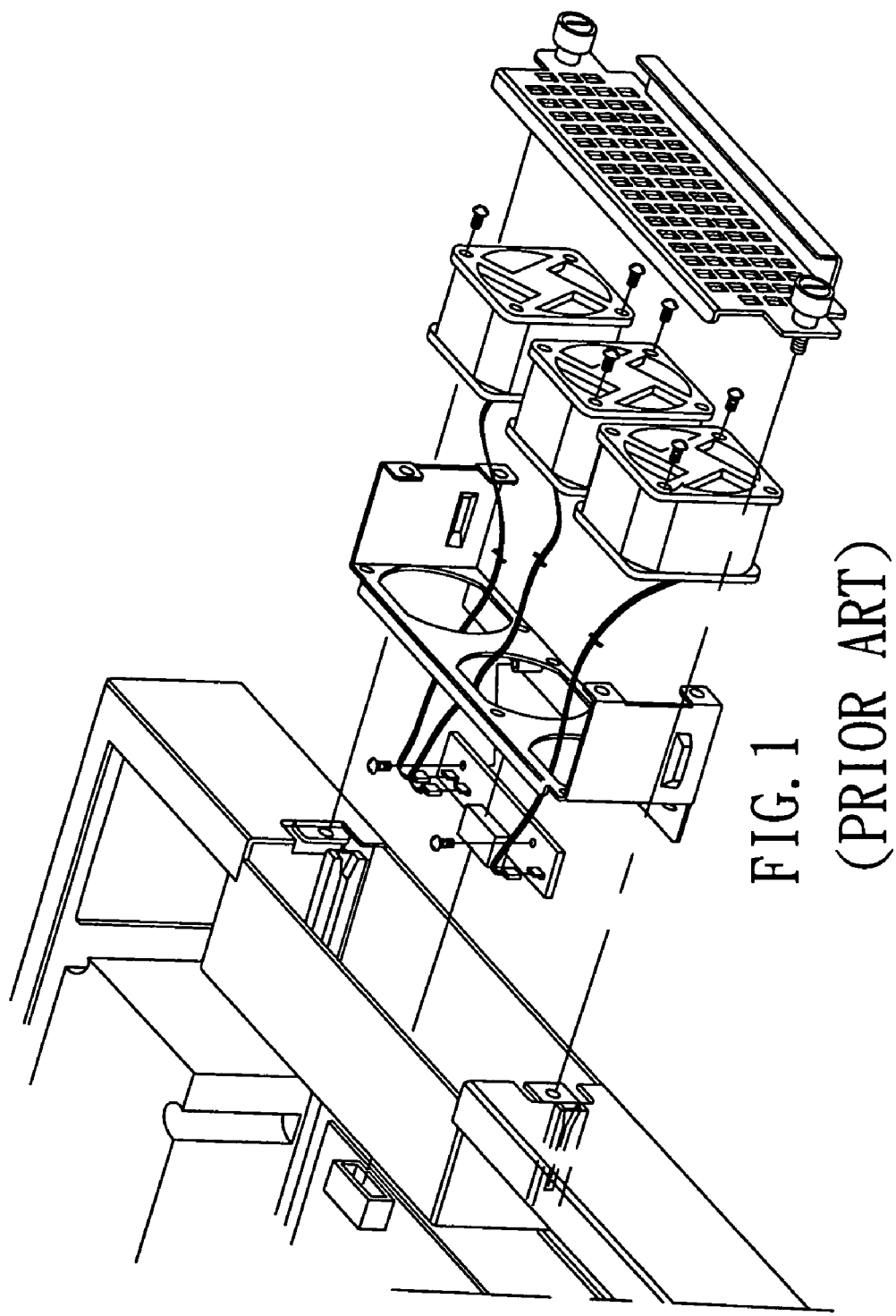
FIG. 1 is a schematic view of a conventional fan.
Figure 2:
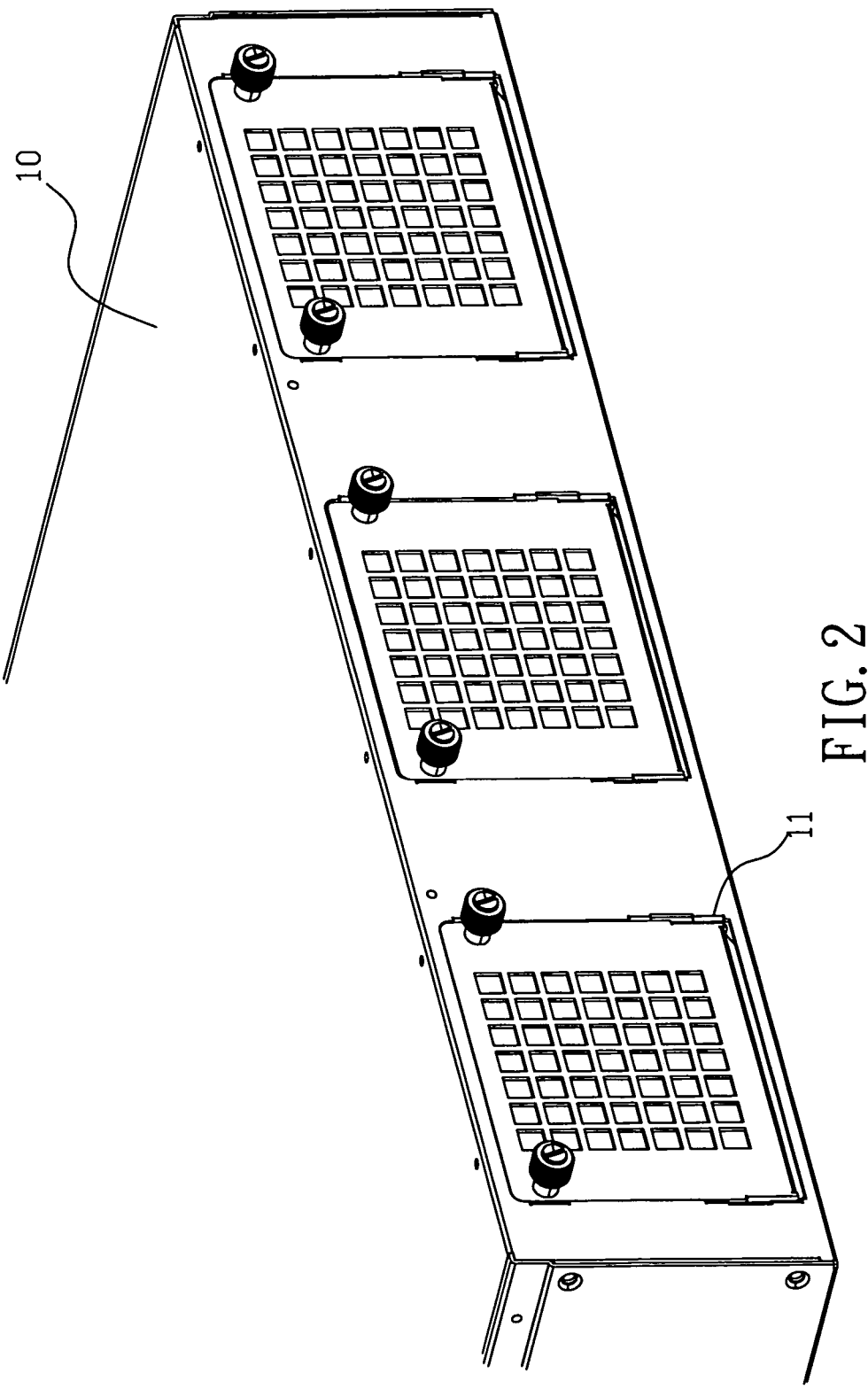
FIG. 2 is a perspective view of the present invention.
Figure 3:
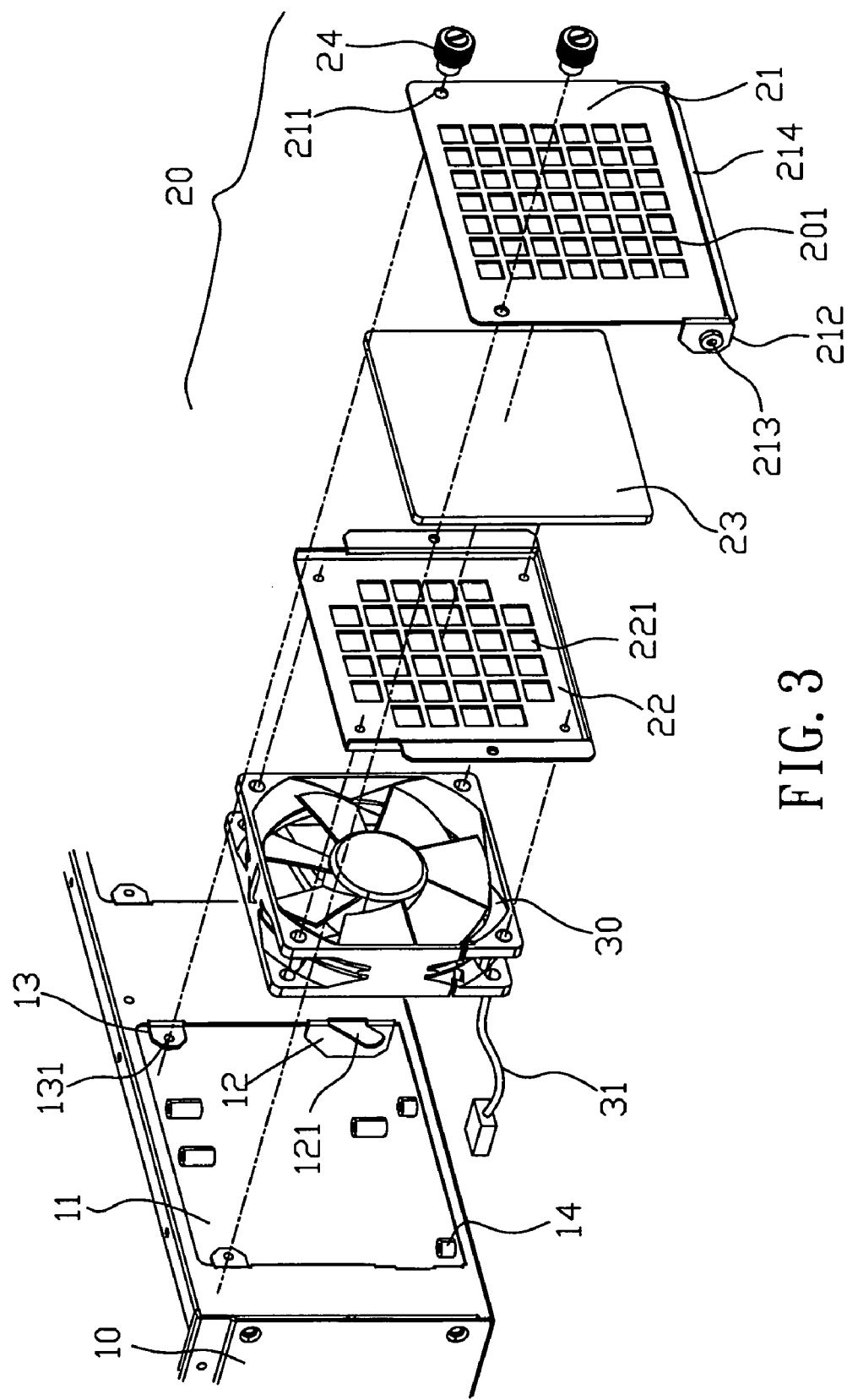
FIG. 3 is an exploded view of the present invention.

Referring to FIGS. 2 and 3 for a detachable fan apparatus for quick maintenance in accordance with the present invention, the fan is installed onto a computer casing 10, and a surface of the computer casing 10a has at least one opening 11 (wherein this embodiment has three openings 11, but the number of openings can vary according to actual requirements), and both sides of the opening 11 separately have a protruding ear 12, and each protruding ear 12 is disposed corresponding to each pivotal hole 121, and the pivotal holes 121 are inclined to a predetermined angle (which is 45 degrees in this embodiment), and both sides of the opening 11 separately include a protruding plate 13, and each protruding plate 13 has a locking hole 131, and the protruding ear 12 and the protruding plate 13 are disposed proximate to distal edges, and the computer casing 10 has a stopping pillar 14 proximate to the opening 11.

Further, a frame 20 is pivotally connected to the opening 11, and the frame 20 has a rear panel 21, and the rear panel 21 has a plurality of meshes 201, and the rear panel 21 includes a partition 22 with meshes 221 thereon, such that a gap is maintained between the partition 22 and the rear panel 21 for installing a filter 23, and a fan 30 is secured onto the partition 22 and has an electric plug 31 connected to an electric circuit and a power supply in the computer casing 10. Both sides of the rear panel 21 separately have a locking hole 211 for securing a screw rod 24, and the screw rod 24 can be passed through the locking hole 211 and secured onto the locking hole 131. Further, both sides of the rear panel 21 separately have an inwardly curved bent plate 212, and each bent plate 212 has a protruding axial rod 213, and the axial rod 213 is embedded into the pivotal hole 121, such that the rear panel 21 can be pivotally connected to the opening 11. The rear panel 21 has a stopping plate 214, such that if the stopping plate 214 at the rear panel 21 is turned outward from the opening 11, the stopping plate 214 will press on the stopping pillar 14 to erect the rear panel 21 at its position (as shown in FIG. 6).

Figure 4:
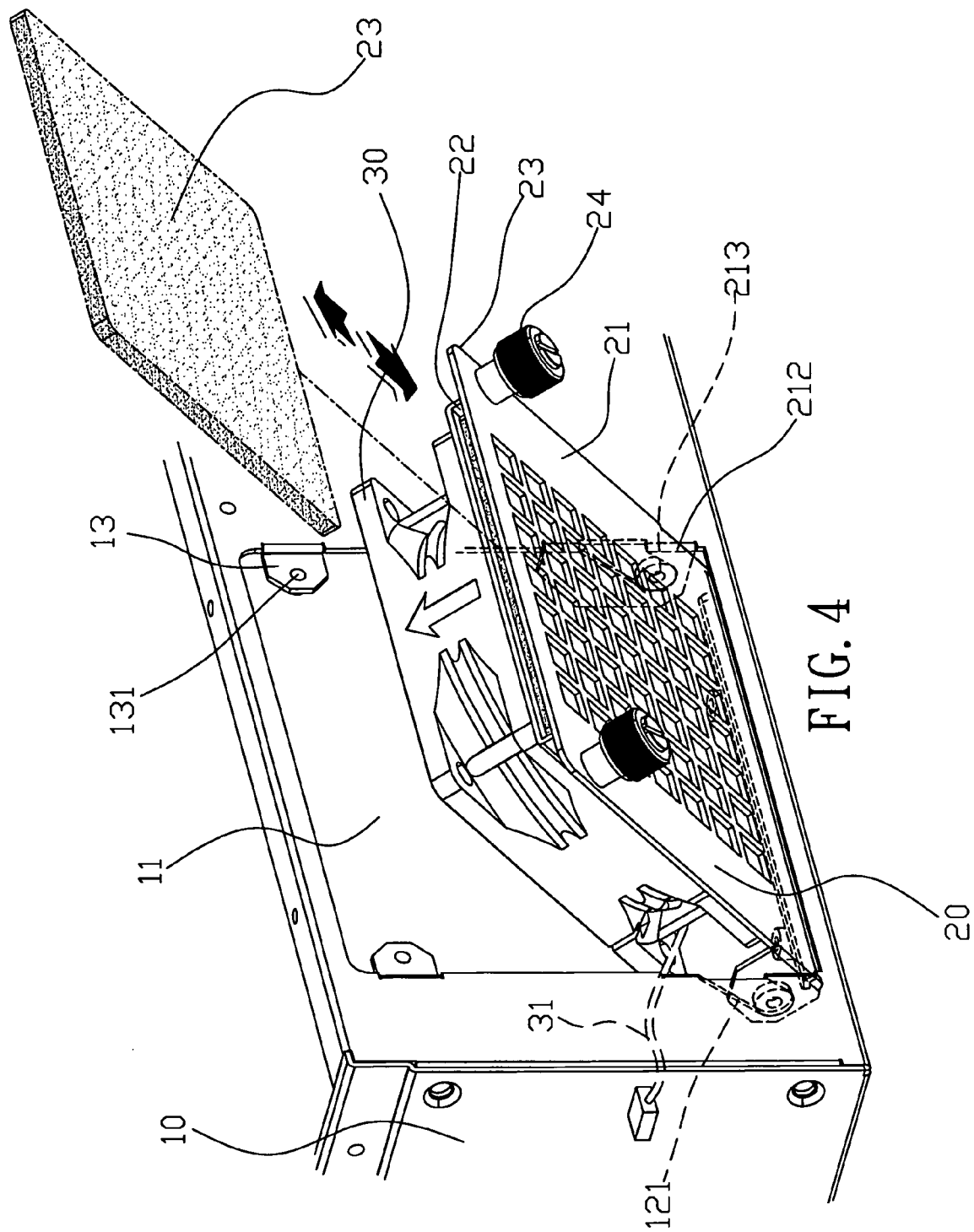
FIG. 4 is a schematic view of an operation of the present invention.
Figure 5:
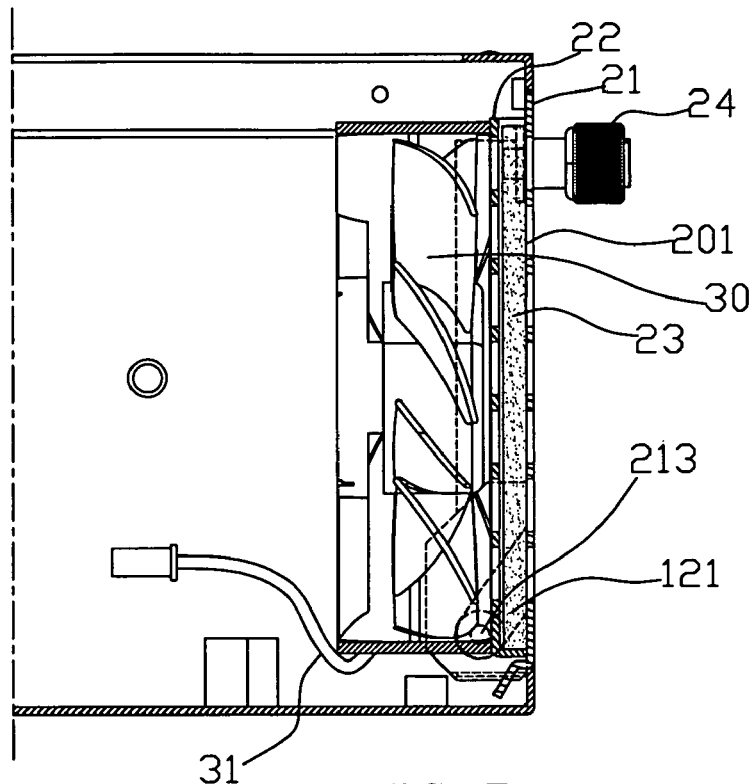
FIG. 5 is a cross-sectional view of closing a frame onto a computer casing in accordance with the present invention.
Figure 6:
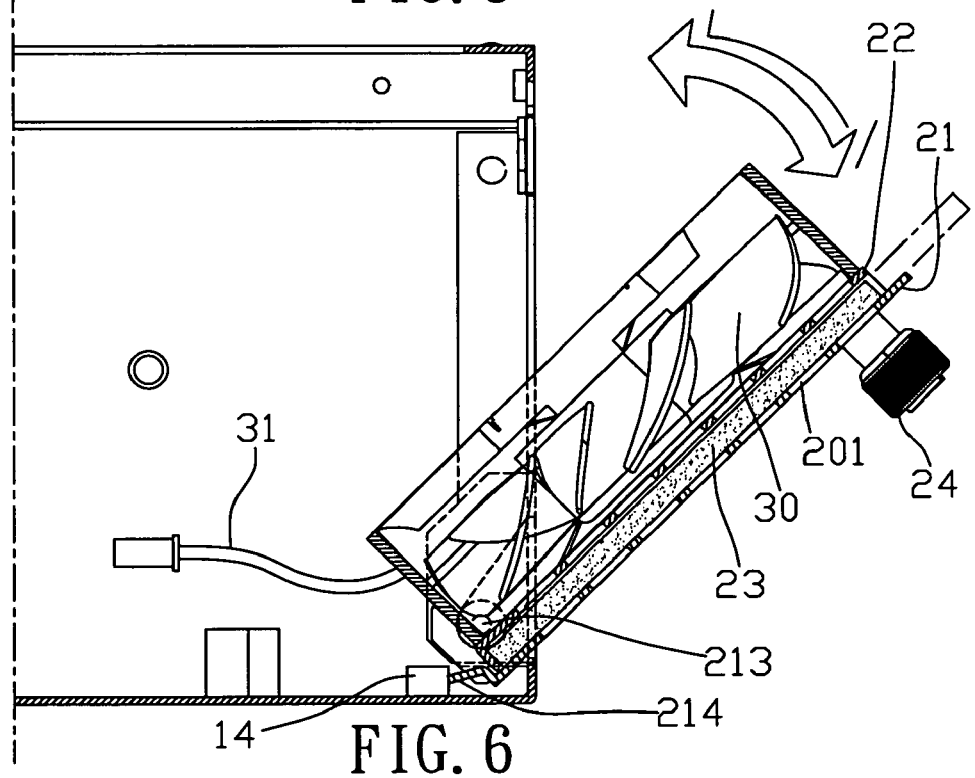
FIG. 6 is a cross-sectional view of lifting up and opening a frame in accordance with the present invention.

When the fan apparatus is used as shown in FIGS. 4 to 6, the axial rods 213 are embedded into the pivotal holes 121 respectively, such that the rear panel 21 is pivotally connected to the opening 11 to seal the opening 11 (as shown in FIG. 5), and the fan 30 can be electrically connected to the electric circuit and a power supply in the computer casing 10. On the other hand, if it is necessary to change a filter 23, a user simply loosens the screw rod 24 to separate the screw rod 24 from the locking hole 131, and turns the frame 20 naturally outward to a specific angle by the inclined pivotal hole 121 to allow the user to conveniently remove and change the filter 23. Such arrangement can achieve the effect of a convenient use without interrupting the operation of the fan or removing the whole frame.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation, the present invention enhances the performance than the conventional structure and further complies with the patent application requirements and is duly filed for the patent application.

What is claimed is:

1. A detachable fan apparatus for quick maintenance, comprising:

a computer casing having at least one opening disposed on a surface of the computer casing, a protruding ear disposed on two opposed sides of the opening, a pivotal hole formed in each of the protruding ears, and a stopping pillar disposed at a position proximate to the opening;

a frame pivotally coupled to the ears, the frame having a rear panel and a partition fixed onto the rear panel, the rear panel and the partition forming a gap therebetween for holding a filter, axial rods disposed on said rear panel at a first end of the frame such that the axial rods are configured to be embedded into respective said pivotal holes, and a stopping plate disposed on said frame and configured to correspond to said stopping pillar; and a fan fixed onto a surface of said partition such that when a second end of the frame is secured with the computer casing the frame is fixed onto the surface of the computer casing, and when it is necessary to change the filter, the second end of the frame is separated from the computer casing and the frame is turned outward until the stopping plate is pressed onto the stopping pillar so that the frame is inclined to a predetermined angle for removing and replacing the filter.

2. The detachable fan apparatus for quick maintenance of claim 1, wherein said pivotal holes are inclined to a predetermined angle.

3. The detachable fan apparatus for quick maintenance of claim 1, wherein said fan is coupled to a power supply in said computer casing directly by an electric circuit.

4. The detachable fan apparatus for quick maintenance of claim 1, wherein said rear panel and partition have meshes thereon.

\* \* \* \* \*